(12) United States Patent
Fujita

(10) Patent No.: US 6,373,350 B1
(45) Date of Patent: Apr. 16, 2002

(54) BRANCHING FILTER WITH SAW-RESONATOR TRANSMITTING AND RECEIVING FILTERS IN SEPARATE PACKAGES AND RECEIVING-BRANCH LINES IN BOTH PACKAGES

(75) Inventor: Yoshiaki Fujita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/451,704

(22) Filed: Dec. 1, 1999

(30) Foreign Application Priority Data

Dec. 1, 1998 (JP) .......................................... 10-341377

(51) Int. Cl.[7] .............................. H03H 9/72; H03H 9/64
(52) U.S. Cl. ...................................... 333/133; 333/193
(58) Field of Search .......................... 333/133, 193–196

(56) References Cited

FOREIGN PATENT DOCUMENTS

| JP | 2-29109 | * | 1/1990 | ................. 333/193 |
|---|---|---|---|---|
| JP | 6-6170 | * | 1/1994 | ................. 333/193 |
| JP | 06097761 | | 4/1994 | |
| JP | 7-38376 | * | 2/1995 | |
| JP | 07226607 | | 8/1995 | |
| JP | 8-84045 | * | 3/1996 | |
| JP | 08191230 | | 7/1996 | |
| JP | 09181567 | | 7/1997 | |
| JP | 10270976 | | 10/1998 | |
| JP | 11-17495 | * | 1/1999 | |

* cited by examiner

*Primary Examiner*—Robert Pascal
*Assistant Examiner*—Barbara Summons
(74) *Attorney, Agent, or Firm*—Venable; Robert J. Frank; Michael A. Sartori

(57) ABSTRACT

A branching filter includes a transmitting filter and a receiving filter, both of the SAW-resonator type. The transmitting filter and receiving filter are housed in separate packages. The packages also include coupling circuitry and other necessary circuit elements such as inductor-capacitor chips. Accommodation of the SAW-resonator-type filters and other circuit elements in two separate packages leads to improved performance characteristics.

7 Claims, 6 Drawing Sheets

BRANCHING FILTER WITH SAW-RESONATOR TRANSMITTING AND RECEIVING FILTERS IN SEPARATE PACKAGES AND RECEIVING-BRANCH LINES IN BOTH PACKAGES

BACKGROUND OF THE INVENTION

The present invention relates to a branching filter useful in a compact communication device such as a portable telephone set.

Compact, lightweight portable telephone sets and other portable communication equipment have been undergoing intensive development in recent years. Small, high-performance components are required. The branching filter, which is used as a radio-frequency (RF) filter in such equipment, is one of these components. Incidentally, a branching filter is also referred to as an antenna duplexer.

FIG. 1 is a schematic diagram of a first conventional branching filter, comprising an antenna port 1, inductors 2, 3, 4, a transmitting (TX) filter 5, a receiving (RX) filter 6, a transmitting port 7, and a receiving port 8. The transmitting filter 5 and receiving filter 6 employ dielectric resonators. FIG. 2 is a perspective view of this branching filter, showing the substrate 9 on which the transmitting filter 5 and receiving filter 6 are mounted. FIG. 3 is a perspective view of the underside of the substrate 9, showing the metalized pattern 9a from which the inductors 2, 3, 4 are formed, and the insulating pattern 9b in which the surface of the substrate 9 is exposed.

This first conventional branching filter has good isolation characteristics, because the transmitting filter 5 and receiving filter 6 are mounted separately, but it requires a comparatively large substrate 9 with special patterning to form the inductors 2, 3, 4. There are also problems of mutual interference between interconnecting lines and inadequate separation between the transmitting frequency band and receiving frequency band. A compact, high-performance filter is difficult to achieve with this design.

Surface-acoustic-wave (SAW) filters of the resonator type provide a way to achieve a more compact branching-filter configuration. FIG. 4 shows a second conventional branching filter housed in a single package 10. The interior 11A of the package includes a ground plane 11B, an impedance-matching element 12, a phase-matching element 13, and a trap circuit 14, as well as a transmitting SAW-filter element 15 and a receiving SAW-filter element 16, as described in Japanese Unexamined Patent Application 06097761.

Placing all of the elements of the second conventional branching filter in a single package, however, leads to the problems noted above: mutual interference between interconnecting lines, and inadequate separation between the transmitting and receiving frequency bands.

In the first conventional branching filter, the transmitting filter 5 and receiving filter 6 are sealed in separate packages, but as noted above, the inductors 2, 3, 4 are formed on the substrate 9, increasing the space occupied by the substrate 9 and precluding the design of a very compact branching filter. Furthermore, the basic filter design in FIG. 1 leads to the above-mentioned problems of mutual interference between interconnecting lines and inadequate separation between the transmitting and receiving frequency bands. The second conventional branching filter in FIG. 4, which employs SAW resonators, also exhibits the same problems of mutual interference between interconnecting lines and inadequate separation between the transmitting and receiving frequency bands.

SUMMARY OF THE INVENTION

It is accordingly an object of the present invention to provide a compact, high-performance branching filter.

According to the present invention, a branching filter comprises a first package and a second package. The first package encloses a transmitting filter of the SAW-resonator type. The second package encloses a receiving filter of the SAW-resonator type. The transmitting filter and receiving filter have different passbands. Other necessary elements, such as striplines having a certain length, are incorporated into the first and second packages.

DETAILED DESCRIPTION OF THE INVENTION

Embodiments of the invention will be described with reference to the attached drawings.

Figure 1:
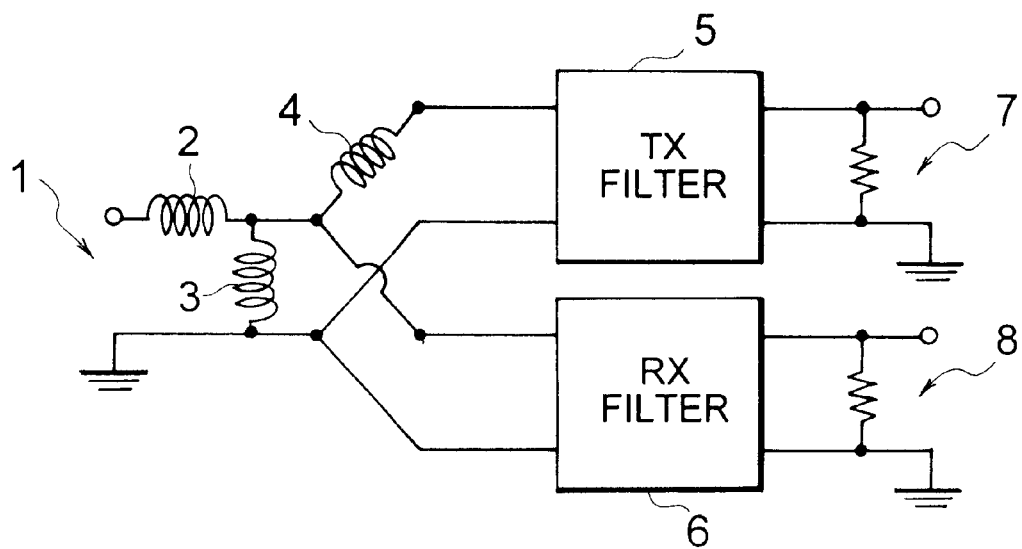
FIG. 1 is a schematic diagram of a first conventional branching filter.
Figure 2:
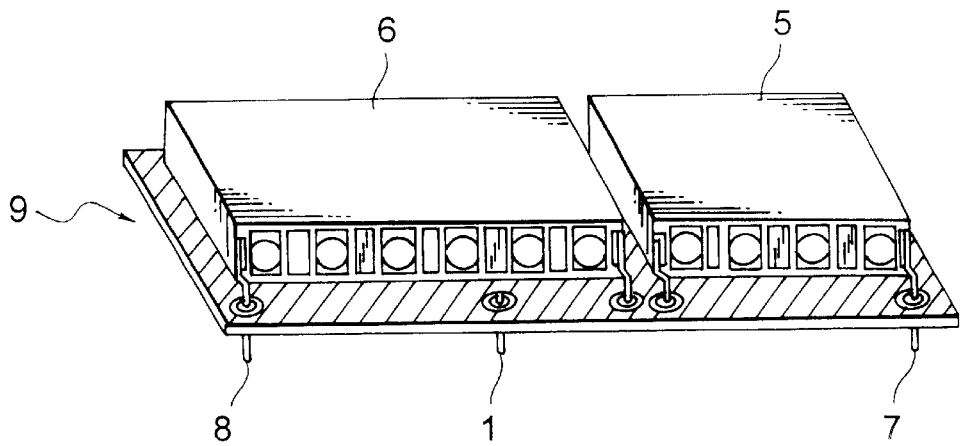
FIG. 2 is a perspective view of the first conventional branching filter.
Figure 3:
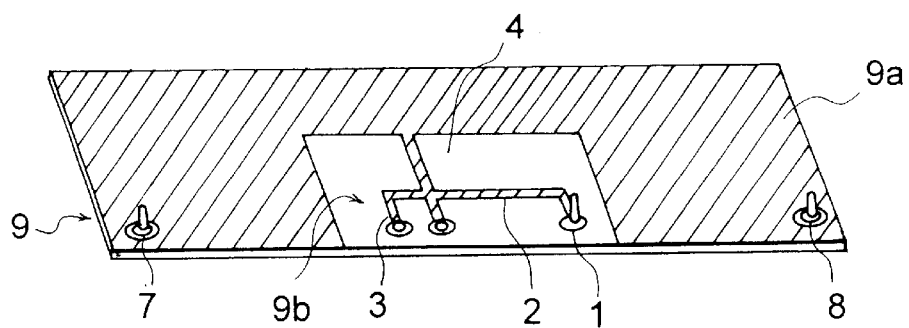
FIG. 3 is a perspective view of the underside of the first conventional branching filter.
Figure 4:
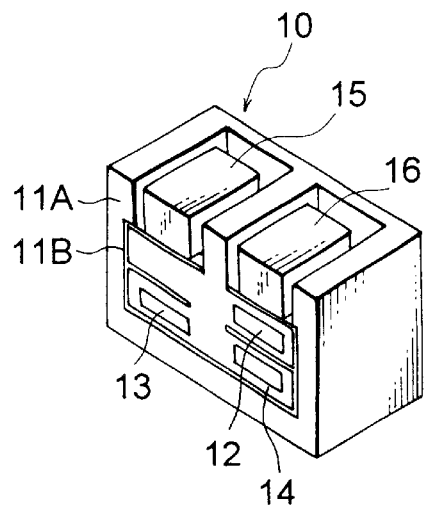
FIG. 4 is a perspective view of a second conventional branching filter.
Figure 5:
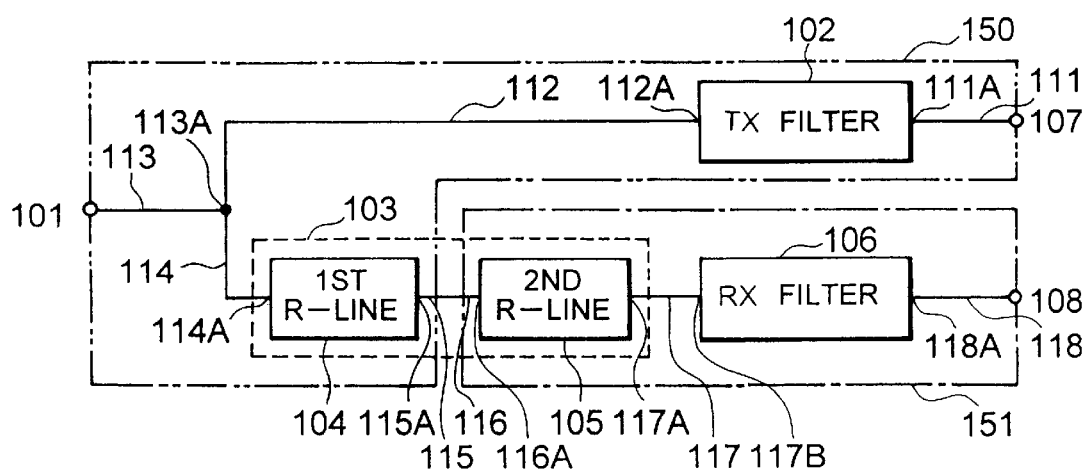
FIG. 5 is a schematic diagram of a branching filter illustrating a first embodiment of the invention.

Referring to FIG. 5, the first embodiment is a branching filter of the SAW-resonator type comprising an antenna terminal 101, a transmitting filter 102, and coupling circuitry including a receiving-branch or R-branch signal line 103. The R-branch signal line 103 is divided into a first R-branch signal line 104 and a second R-branch signal line 105. The branching filter also includes a receiving filter 106, a transmitting terminal 107, a receiving terminal 108, interconnecting lines 111, 112, 113, 114, 115, 116, 117, 118, and interconnection points 111A, 112A, 113A, 114A, 115A, 116A, 117A, 117B, 118A. The transmitting filter 102 and first R-branch signal line 104 are disposed in a transmitting filter package 150. The second R-branch signal line 105 and receiving filter 106 are disposed in a separate receiving filter package 151. The transmitting filter package 150 and receiving filter package 151 both employ, for example, an alumina ($Al_2O_3$) substrate material with a dielectric constant of ten.

Figure 6:
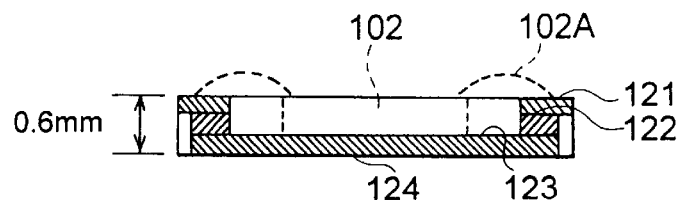
FIG. 6 is a sectional view of the transmitting filter package in the first embodiment.

The cross-sectional structure of the transmitting filter package 150 is shown in FIG. 6. The package has four surfaces or layers 121, 122, 123, 124 on which patterns and via holes are formed. The transmitting filter 102 is disposed in a cavity surrounded by the first and second layers 121, 122, resting on the third layer 123. The height of the transmitting filter package 150 is six-tenths of a millimeter (0.6 mm). The mutual separation between layers 121, 122, 123, 124 is 0.2 mm.

Figure 7:
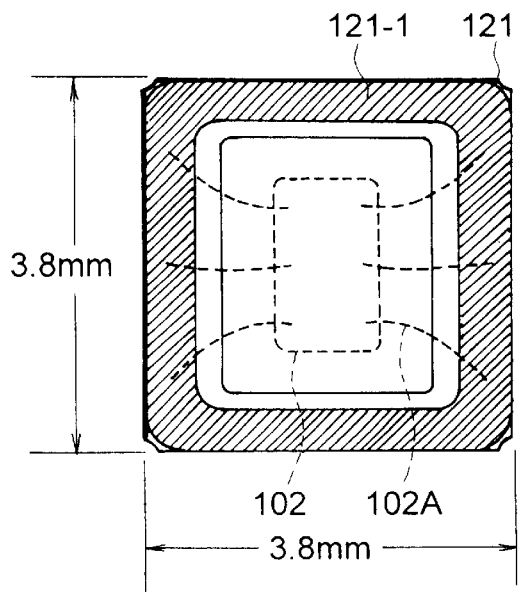
FIG. 7 is a plan view of the first layer in the transmitting filter package.
Figure 8:
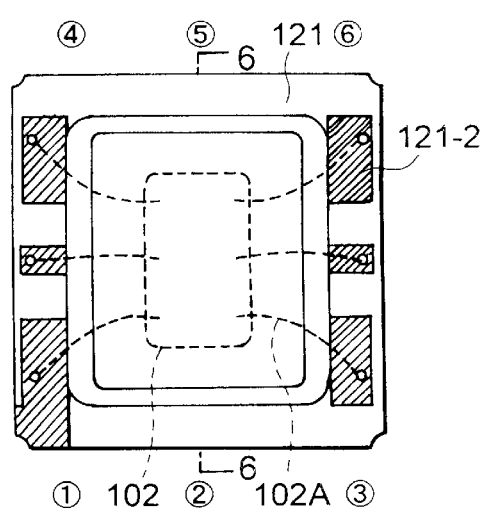
FIG. 8 is another plan view of the first layer in the transmitting filter package.

Referring to FIG. 7, the width and length dimensions of the transmitting filter package 150 are both 3.8 mm. The uppermost pattern formed in the first layer 121 is an alumina coating 121-1. Referring to FIG. 8, a conductive pattern 121-2 is also formed in the first layer 121. Bonding wires 102A connect the conductive pattern 121-2 to the transmitting filter 102.

Figure 9:
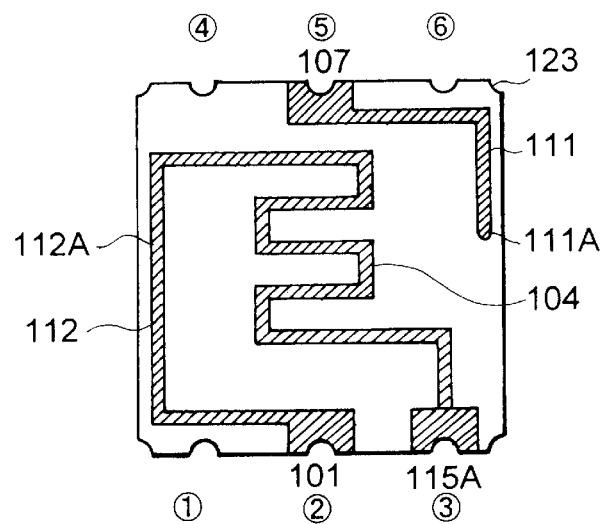
FIG. 9 is a plan view of the third layer in the transmitting filter package.

Referring to FIG. 9, in the third layer 123, the transmitting terminal 107 is connected by interconnecting line 111 to interconnection point 111A, at which a via hole leads to the conductive pattern 121-2 in the first layer 121. The antenna terminal 101 is connected by interconnecting line 112 to interconnection point 112A, at which another via hole leads to the conductive pattern 121-2 in the first layer 121. From this interconnection point 112A, the first R-branch signal line 104 leads to interconnection point 115A, which is a point of interconnection between the transmitting filter package 150 and receiving filter package 151. The interconnecting lines 113, 114 and interconnection points 113A, 114A shown in FIG. 5 are subsumed in interconnection line 112 and interconnection point 112A in FIG. 9.

Figure 10:
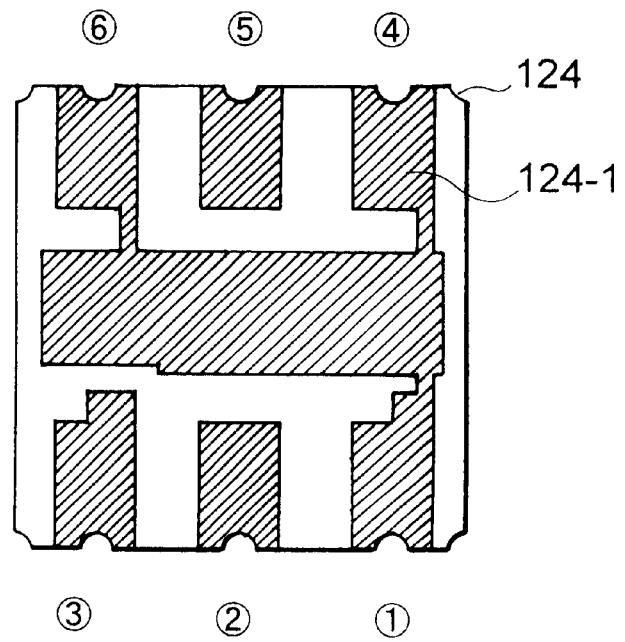
FIG. 10 is a plan view of the fourth layer in the transmitting filter package.

Referring to FIG. 10, a conductive pattern 124-1 is formed in the fourth layer 124. The circled numbers from one to six in FIGS. 8, 9, and 10 are terminal numbers of the transmitting filter package 150. The terminals with circled numbers one, four, and six are ground terminals.

Figure 11:
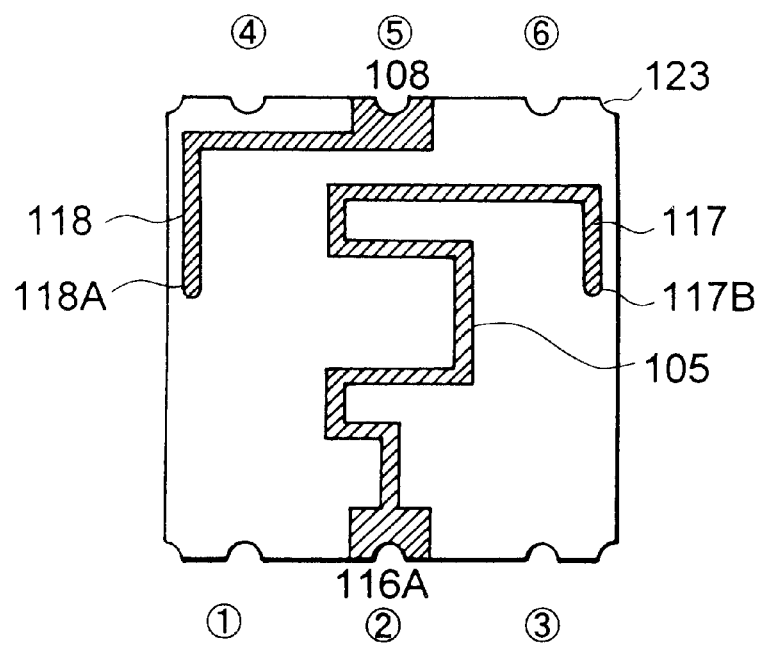
FIG. 11 is a plan view of the third layer in the receiving filter package.

The structure of the receiving filter package 151 is similar to the structure of the transmitting filter package 150, except for the third layer, which is shown in FIG. 11. In the third layer of the receiving filter package 151, the receiving terminal 108 is connected by interconnecting line 118 to a via hole at interconnection point 118A. Interconnection point 116A, which is coupled externally to interconnection point 115A in the transmitting filter package 150, leads through the second R-branch signal line 105 and interconnecting line 117 to another via hole at interconnection point 117B.

The dimensions of the receiving filter package 151 are identical to the dimensions of the transmitting filter package 150.

The total length LL in millimeters of the R-branch signal line 103 is distributed among the transmitting filter package 150 and receiving filter package 151 as shown above to obtain a high-performance branching filter. If LT is the length (in millimeters) of the first R-branch signal line 104 disposed in the transmitting filter package 150, and LR is the length (in millimeters) of the second R-branch signal line 105 disposed in the receiving filter package 151, then the following relationship is satisfied:

LL=LT+LR

The first R-branch signal line 104 and second R-branch signal line 105 both have a stripline configuration. The total length LL of the R-branch signal line 103 is selected to yield desired circuit characteristics such as impedance and phase characteristics. The length of the R-branch signal line is normally set to one-fourth the wavelength of the signal to be received ($\lambda/4$). There is no corresponding transmitting-branch or T-branch signal line; the length of the T-branch signal line is set to zero.

In a variation of the first embodiment, an additional layer is added to the receiving filter package 151, enabling the receiving filter package to accommodate the entire length LL of the R-branch signal line 103. The portion of the R-branch signal line 103 of length LT is moved from the transmitting filter package 150 to the additional layer in the receiving filter package 151. The additional length LT can also be disposed on the cover of the receiving filter 106, instead of in an additional layer in the receiving filter package 151.

Next, a second embodiment will be described. The packages in the second embodiment are suitable when strict requirements regarding spurious signals must be satisfied.

Figure 12:
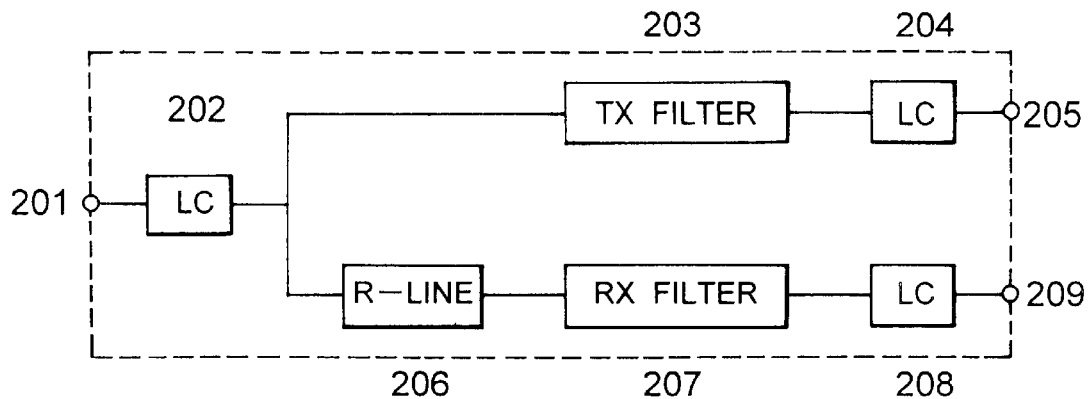
FIG. 12 is a schematic diagram of a branching filter illustrating a second embodiment of the invention.

Referring to FIG. 12, the second embodiment is a branching filter comprising an antenna terminal 201, an antenna-side inductor-capacitor chip or LC chip 202, a transmitting filter 203, a transmitting-side LC chip 204, a transmitting terminal 205, an R-branch signal line 206 (including a first R-branch signal line and a second R-branch signal line), a receiving filter 207, a receiving-side LC chip 208, and a receiving terminal 209. The coupling circuitry in the second embodiment includes the LC chips 202, 204, 208 and R-branch signal line 206. Other component elements are as described in the first embodiment. The transmitting filter 203 and receiving filter 207 are filters of the SAW-resonator type.

This embodiment employs LC chips 202, 204, 208 to obtain improved spurious-signal rejection characteristics. To accommodate LC chips 202 and 204, an extra layer may be provided in the transmitting filter package. Alternatively, these LC chips may be embedded in the substrate material of the transmitting filter package.

Next, a third embodiment will be described. The third embodiment is suitable when high performance is required; that is, when low insertion loss and high out-of-band attenuation are required.

Figure 13:
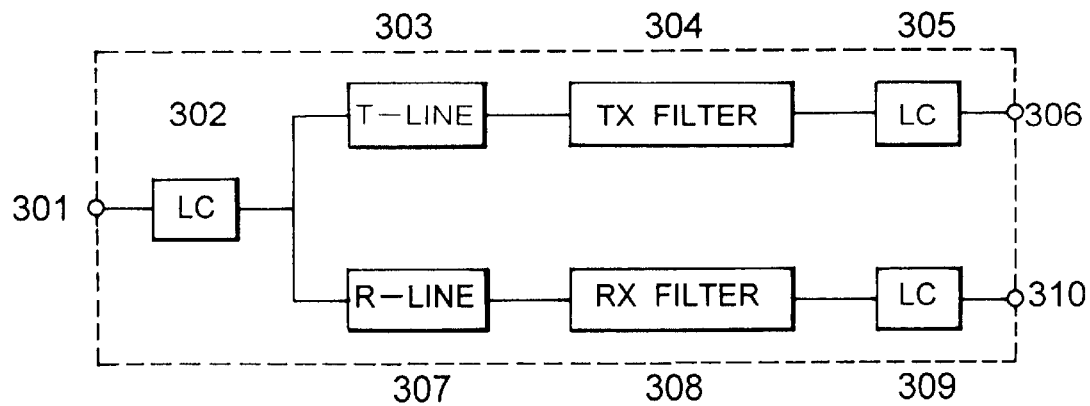
FIG. 13 is a schematic diagram of a branching filter illustrating a third embodiment of the invention.

Referring to FIG. 13, the third embodiment is a branching filter comprising an antenna terminal 301, an antenna-side LC chip 302, a transmitting-branch (T-branch) signal line 303, a transmitting filter 304, a transmitting-side LC chip 305, a transmitting terminal 306, an R-branch signal line 307, a receiving filter 308, a receiving-side LC chip 309, and a receiving terminal 310. The coupling circuitry in the third embodiment includes the LC chips 302, 305, 309, T-branch signal line 303, and R-branch signal line 307. Other component elements are as described in the first embodiment. The transmitting filter 304 and receiving filter 308 are filters of the SAW-resonator type.

Due to the incorporation of the T-branch signal line 303 as well as the R-branch signal line 307, and of the LC chips 302, 305, 309, high performance characteristics are obtained. As in the second embodiment, an extra layer may be provided in the transmitting filter package, or the LC chips may be embedded in the substrate material.

In the embodiments described above, the transmitting filter and receiving filter are sealed in independent packages, together with striplines and LC chips as necessary, so good isolation between the transmitting band and receiving band is obtained, and there is little mutual interference between interconnecting lines. A branching filter of the SAW-resonator type having improved performance characteristics can thus be obtained.

A few variations of the embodiments have been mentioned above, but those skilled in the art will recognize that further variations are possible within the scope claimed below.

What is claimed is:

1. A branching filter employing surface-acoustic-wave-resonator-type filters as a transmitting filter and a receiving filter, having an antenna terminal for coupling the transmitting filter and the receiving filter to an antenna, the transmitting filter and receiving filter having different passbands, comprising:

a first package accommodating said transmitting filter;

a second package accommodating said receiving filter; and a receiving-branch signal line coupling the receiving filter to the antenna terminal, the receiving-branch signal line being divided into a first signal line accommodated in said first package and a second signal line accommodated in said second package.

2. The branching filter of claim 1, further comprising a transmitting-branch signal line coupling the transmitter filter to said antenna terminal.

3. The branching filter of claim 1, wherein:

said first package is a multilayer package and said first signal line comprises a first stripline formed in an internal layer of said first package; and said second package is a multilayer package and said second signal line comprises a second stripline formed in an internal layer of said second package.

4. The branching filter of claim 1, wherein said first signal line and said second signal line are coupled in series with said receiving filter.

5. The branching filter of claim 1, further comprising chips disposed in said first package and said second package, each of said chips comprising an inductor and a capacitor.

6. The branching filter of claim 5, wherein one of said chips is disposed between said transmitting filter and a transmitting terminal and another of said chips is disposed between said receiving filter and a receiving terminal.

7. The branching filter of claim 5, wherein one of said chips couples said antenna terminal with said transmitting filter and said receiving-branch signal line.

* * * * *